(12) United States Patent
Parikh et al.

(10) Patent No.: US 12,047,757 B2
(45) Date of Patent: Jul. 23, 2024

(54) WINDOWING FILTER FOR AMPLIFIER DEVICE

(71) Applicant: Cirrus Logic International Semiconductor Ltd., Edinburgh (GB)

(72) Inventors: Viral Parikh, Austin, TX (US); Jaiminkumar Mehta, Austin, TX (US); Ryan Hellman, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 196 days.

(21) Appl. No.: 17/749,473

(22) Filed: May 20, 2022

(65) Prior Publication Data

US 2023/0142189 A1 May 11, 2023

Related U.S. Application Data

(60) Provisional application No. 63/277,277, filed on Nov. 9, 2021.

(51) Int. Cl.
*H04R 3/04* (2006.01)
*G01R 19/00* (2006.01)
(Continued)

(52) U.S. Cl.
CPC ........... *H04R 3/04* (2013.01); *G01R 19/0007* (2013.01); *G01R 23/16* (2013.01); *G01R 23/165* (2013.01); *G01R 27/02* (2013.01); *G01R 27/08* (2013.01); *H03F 1/34* (2013.01); *H03F 3/183* (2013.01); *H03F 3/217* (2013.01); *H04R 3/002* (2013.01);
(Continued)

(58) Field of Classification Search
CPC .......... H04R 3/04; H04R 29/001; H04R 3/08; H04R 3/002; H04R 9/06; H04R 9/02; H04R 2400/13; H03F 3/217; H03F 1/34; H03F 3/183; G01R 27/2611; G01R 27/08; G01R 23/16; G01R 19/0007; G01R 23/165; G01R 27/02
See application file for complete search history.

(56) References Cited

U.S. PATENT DOCUMENTS 5,719,526 A * 2/1998 Fink .................... H03F 1/34
330/105
9,800,206 B2 * 10/2017 Blyth ..................... H03F 3/183
(Continued)

FOREIGN PATENT DOCUMENTS

| CN | 110161391 A | 1/2021 |
| EP | 0768537 A | 4/1997 |
| JP | 6282363 A | 4/1987 |

OTHER PUBLICATIONS

Combined Search and Examination Report under Sections 17 and 18(3), UKIPO, Application No. GB2215088.2, mailed Apr. 17, 2023.
(Continued)

*Primary Examiner* — Carolyn R Edwards
*Assistant Examiner* — Kuassi A Ganmavo
(74) *Attorney, Agent, or Firm* — Jackson Walker L.L.P.

(57) ABSTRACT

A method may include measuring a physical quantity associated with a load driven by an amplifier, generating a windowing function having a variable length and based on a number of samples of the physical quantity to be processed, applying the windowing function to the physical quantity, performing a transform on the physical quantity as filtered by the windowing function, and determining a characteristic of the load based on the transform.

17 Claims, 3 Drawing Sheets

(51) Int. Cl.
*G01R 23/16* (2006.01)
*G01R 23/165* (2006.01)
*G01R 27/02* (2006.01)
*G01R 27/08* (2006.01)
*H03F 1/34* (2006.01)
*H03F 3/183* (2006.01)
*H03F 3/217* (2006.01)
*H04R 3/00* (2006.01)
*H04R 3/08* (2006.01)
*H04R 9/02* (2006.01)
*H04R 9/06* (2006.01)
*H04R 29/00* (2006.01)

(52) U.S. Cl.
CPC .............. *H04R 3/08* (2013.01); *H04R 9/02* (2013.01); *H04R 9/06* (2013.01); *H04R 29/001* (2013.01); *H04R 2400/13* (2013.01)

(56) References Cited

U.S. PATENT DOCUMENTS

| | | | | |
|---|---|---|---|---|
| 10,042,796 | B2* | 8/2018 | Zwart | G06F 13/3625 |
| 2010/0194413 | A1* | 8/2010 | Dalbjorn | H03F 1/52 |
| | | | | 324/713 |
| 2011/0227587 | A1* | 9/2011 | Nakanishi | G01R 31/389 |
| | | | | 324/649 |
| 2012/0170632 | A1* | 7/2012 | Walker | H04B 17/10 |
| | | | | 375/224 |
| 2014/0086418 | A1* | 3/2014 | Lubberhuizen | H04R 3/007 |
| | | | | 381/55 |
| 2015/0086028 | A1* | 3/2015 | Gaiser | H04R 29/001 |
| | | | | 381/59 |
| 2015/0117655 | A1* | 4/2015 | Edgren | H04R 29/00 |
| | | | | 381/59 |
| 2015/0181318 | A1* | 6/2015 | Gautama | H04R 3/002 |
| | | | | 381/59 |
| 2022/0029505 | A1 | 1/2022 | Khenkin et al. | |

OTHER PUBLICATIONS

Stack overflow window size vs. data length in FFT, https://stackoverflow.com/questions/5570355/window-size-vs-data-length-for-fft.

* cited by examiner

WINDOWING FILTER FOR AMPLIFIER DEVICE

RELATED APPLICATION

The present disclosure claims priority to U.S. Provisional Patent Application Ser. No. 63/277,277, filed Nov. 9, 2021, which is incorporated by reference herein in its entirety.

FIELD OF DISCLOSURE

The present disclosure relates in general to methods, apparatuses, or implementations for monitoring loads with complex impedances. Embodiments set forth herein may also disclose improvements for implementing a windowing filter used in connection with such monitoring.

BACKGROUND

A signal playback system may include an amplifier, such as a Class-D driver, configured to drive a playback signal to an electromagnetic load, such as a speaker or haptic transducer.

In order to provide for protection of the load, and for other purposes, signal playback systems often include circuits for monitoring a voltage and a current associated with the load. For example, such monitored voltage and current may be used to determine a complex impedance of a load, which complex impedance may be used to estimate a displacement of the load.

In some applications, a signal playback system may compute complex impedance in the frequency domain using a discrete Fourier transform algorithm. In such implementations, the measured voltage signal and measured current signal may each pass through a windowing filter of variable length to reduce leakage in the discrete Fourier transform calculation. As described in greater detail herein, traditional approaches to performing windowing may have disadvantages.

SUMMARY

In accordance with the teachings of the present disclosure, the disadvantages and problems associated with existing approaches for monitoring a complex impedance may be reduced or eliminated.

In accordance with embodiments of the present disclosure, a method may include measuring a physical quantity associated with a load driven by an amplifier, generating a windowing function having a variable length and based on a number of samples of the physical quantity to be processed, applying the windowing function to the physical quantity, performing a transform on the physical quantity as filtered by the windowing function, and determining a characteristic of the load based on the transform.

In accordance with these and other embodiments of the present disclosure, a system may include a sensor configured to measure a physical quantity associated with a load driven by an amplifier and a processing circuit communicatively coupled to the sensor and configured to generate a windowing function having a variable length and based on a number of samples of the physical quantity to be processed, apply the windowing function to the physical quantity, perform a transform on the physical quantity as filtered by the windowing function, and determine a characteristic of the load based on the transform.

In accordance with these and other embodiments of the present disclosure, a host device may include an amplifier configured to drive a load, a sensor configured to measure a physical quantity associated with the load, and a processing circuit communicatively coupled to the sensor and configured to generate a windowing function having a variable length and based on a number of samples of the physical quantity to be processed, apply the windowing function to the physical quantity, perform a transform on the physical quantity as filtered by the windowing function, and determine a characteristic of the load based on the transform.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
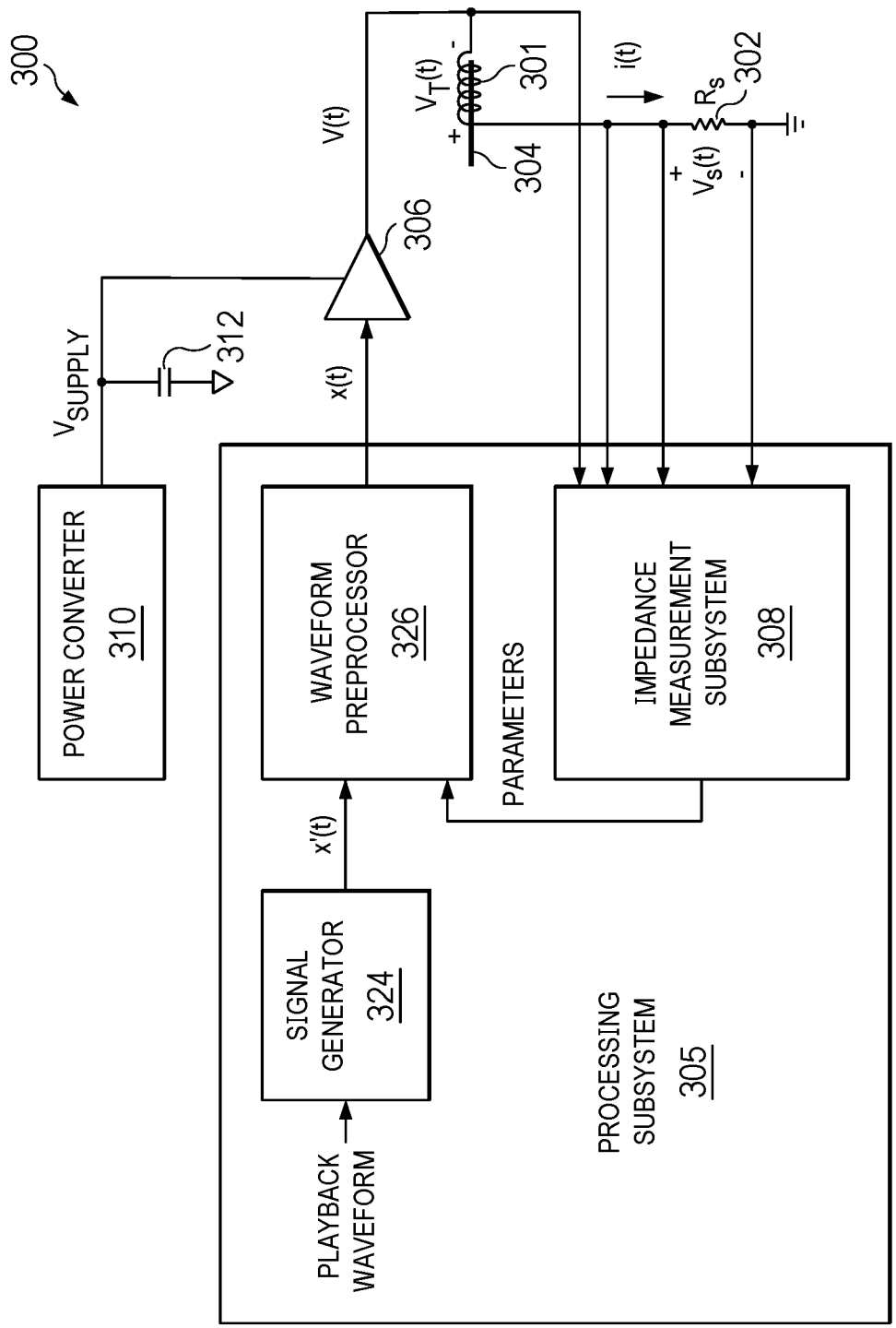
FIG. 1 illustrates selected components of an example host device, in accordance with embodiments of the present disclosure.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection-type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal may generally be an analog time varying voltage signal, for example, a time varying waveform.

To accurately sense displacement of an electromagnetic load, methods and systems of the present disclosure may determine an impedance of the electromagnetic load, and then convert the impedance to a position signal, as described in greater detail below. Further, to measure impedance of an electromagnetic load, methods and systems of the present disclosure may utilize either a phase measurement approach and/or a high-frequency pilot-tone driven approach, as also described in greater detail below.

To illustrate, an electromagnetic load may be driven by a driving signal V(t) to generate a sensed terminal voltage $V_T(t)$ across a coil of the electromagnetic load. Sensed terminal voltage $V_T(t)$ may be given by:

$$V_T(t) = Z_{COIL} I(t) + V_B(t)$$

wherein I(t) is a sensed current through the electromagnetic load, $Z_{COIL}$ is an impedance of the electromagnetic load, and $V_B(t)$ is the back-electromotive force (back-EMF) associated with the electromagnetic load.

As used herein, to "drive" an electromagnetic load means to generate and communicate an actuation signal to the electromagnetic load to cause displacement of a movable mass of the electromagnetic load. Further, to "drive" an electromagnetic load may also mean driving of a pilot signal or other test signal to the electromagnetic load from which electrical parameters of the electromagnetic load may be measured.

Because back-EMF voltage $V_B(t)$ may be proportional to velocity of the moving mass of the electromagnetic load, back-EMF voltage $V_B(t)$ may in turn provide an estimate of such velocity. Thus, velocity of the moving mass may be recovered from sensed terminal voltage $V_T(t)$ and sensed current I(t) provided that either: (a) sensed current I(t) is equal to zero, in which case $V_B(t) = V_T(t)$; or (b) coil impedance $Z_{COIL}$ is known or is accurately estimated.

Position of the moving mass may be related to an impedance of the electromagnetic load, including a coil inductance $L_{COIL}$ of the electromagnetic load. At high frequencies significantly above the bandwidth of the electromagnetic load, back-EMF voltage $V_B(t)$ may become negligible and inductance may dominate the coil impedance $Z_{COIL}$. Sensed terminal voltage $V_{T@HF}(t)$ at high frequencies may be estimated by:

$$V_{T@HF}(t) = Z_{COIL} I_{@HF}(t)$$

An inductance component of coil impedance $Z_{COIL}$ may be indicative of a position or a displacement of the moving mass of the electromagnetic load. To illustrate, such inductance may be a nominal value when the moving mass is at rest. When the mass moves, the magnetic field strength may be modulated by the position of the mass which leads to a small alternating-current (AC) modulation signal of the inductance that is a function of the mass position.

Hence, at high frequencies, the position of the moving mass of the electromagnetic load may be recovered from sensed terminal voltage $V_T(t)$ and sensed current I(t) by: (a) estimating the coil impedance at high frequency as $Z_{COIL@HF} \cong R_{@HF} + L_{@HF} \cdot s$, where $R_{@HF}$ is the resistive part of the coil impedance at high frequency, L@HF is the coil inductance at high frequency, and s is the Laplace transform; and (b) converting the measured inductance to a position signal. Velocity and/or position may be used to control vibration of the moving mass of the electromagnetic load.

FIG. 1 illustrates selected components of an example host device 300 having an electromagnetic actuator 304. Host device 300 may include, without limitation, a mobile device, home application, vehicle, and/or any other system, device, or apparatus that includes a human-machine interface. Electromagnetic actuator 304 may include any suitable load with a complex impedance, including without limitation a haptic transducer, a loudspeaker, a microspeaker, a voice-coil actuator, a solenoid, or other suitable transducer.

In operation, a signal generator 324 of a processing subsystem 305 of host device 300 may generate a raw transducer driving signal x'(t) (which, in some embodiments, may be a waveform signal, such as a haptic waveform signal or audio signal). Raw transducer driving signal x'(t) may be generated based on a desired playback waveform received by signal generator 324.

Raw transducer driving signal x'(t) may be received by waveform preprocessor 326 which may modify raw transducer driving signal x'(t) based on parameters received from impedance measurement subsystem 308 and/or based on any other factor in order to generate processed transducer driving signal x(t). For example, such modification may include control of processed transducer driving signal x(t) in order to prevent overexcursion of electromagnetic actuator 304 that could lead to damage.

Processed transducer driving signal x(t) may in turn be amplified by amplifier 306 to generate a driving signal V(t) for driving electromagnetic load 301. As shown in FIG. 1, amplifier 306 may be powered from a supply voltage $V_{SUPPLY}$ generated by a power converter 310 or other power source, such that supply voltage $V_{SUPPLY}$ is present across a capacitor 312.

A sensed terminal voltage $V_T(t)$ of electromagnetic load 301 may be sensed by impedance measurement subsystem 308 (e.g., using a volt-meter). Similarly, sensed current I(t) through electromagnetic load 301 may be sensed by impedance measurement subsystem 308. For example, current I(t) may be sensed by a sense voltage $V_S(t)$ across a shunt resistor 302 having resistance $R_s$ coupled to a terminal of electromagnetic load 301.

As shown in FIG. 1, and as described in greater detail below, processing subsystem 305 may include an impedance measurement subsystem 308 that may estimate respective coil inductances $L_{COIL}$ of electromagnetic load 301. From such estimated coil inductance $L_{COIL}$, impedance measurement subsystem 308 may determine a displacement associated with electromagnetic load 304. Based on such determined displacement, impedance measurement subsystem 308 may communicate one or more parameters to waveform preprocessor 326 (including, without limitation, the value of such displacement), which may cause waveform preprocessor 326 to modify raw transducer driving signal x'(t). In some embodiments, such displacement may also be indicative of a human interaction (e.g., applied force) to electromagnetic actuator 304.

In operation, to estimate impedance $Z_{COIL}$ impedance measurement subsystem 308 may measure impedance in any suitable manner, including without limitation using the approaches set forth in U.S. patent. application Ser. No. 17/497,110 filed Oct. 8, 2021, which is incorporated in its entirety by reference herein.

As a particular example, in order to estimate coil impedance $Z_{COIL}$, waveform preprocessor 326 may generate processed transducer driving signal x(t) comprising a high-frequency stimulus for driving the sensing coil. In response, impedance measurement subsystem 308 may measure impedance of the sensing coil.

Various approaches may be used to estimate coil impedance $Z_{COIL}$, including time and frequency domain methods. For example, frequency domain methods reliant on calculation of a discrete Fourier transform may have an advantage of implicit binning of a frequency spectrum depending on a length of time for which current and voltage samples are collected. As a specific instance, computing a discrete Fourier transform on sensed currents and sense terminal voltages at a 200-μs duration results in frequency bins of 5 KHz. Additional windowing of a signal prior to application of the discrete Fourier transform may filter out harmonics and attenuate frequencies far from the signal frequency. Accordingly, measurement accuracy when using such an approach may only be affected by interfering energy or noise that falls within a signal bin or at peaks of the windowing function.

Figure 2:
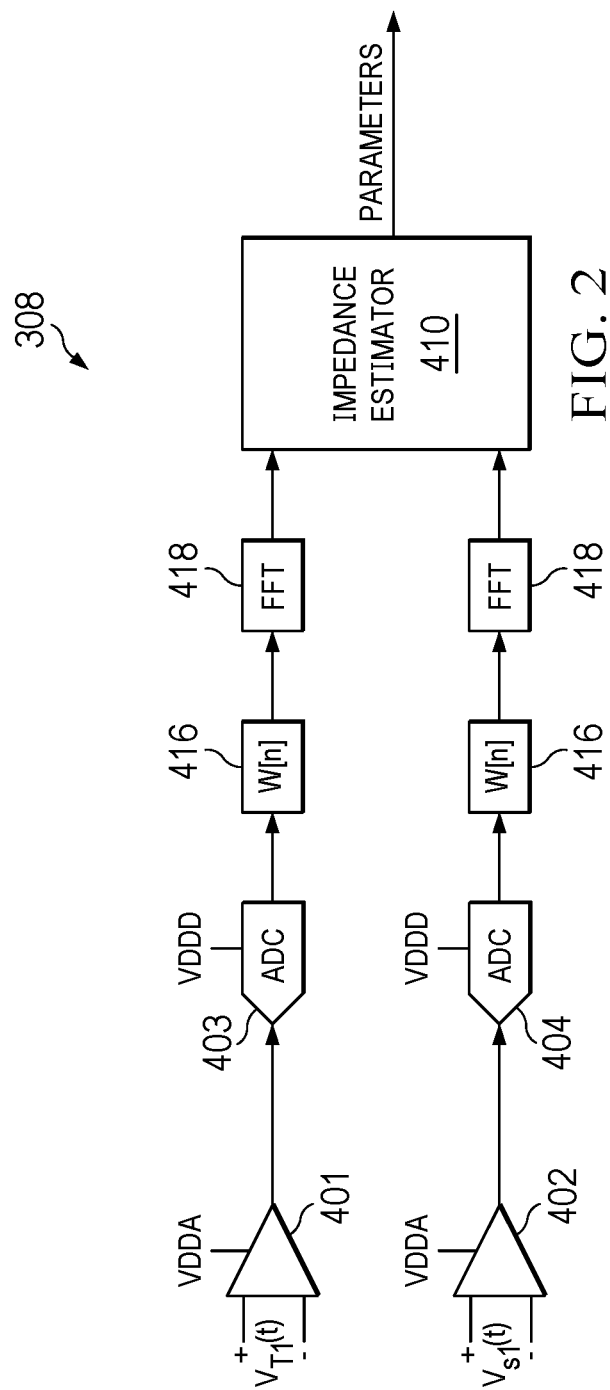
FIG. 2 illustrates selected components of an example impedance measurement subsystem, in accordance with embodiments of the present disclosure.

FIG. 2 illustrates selected components of an example impedance measurement subsystem 308, in accordance with embodiments of the present disclosure. As shown in FIG. 2, sensed terminal voltage $V_T(t)$ of electromagnetic load 301 may be conditioned by an analog front end (AFE) 401, and converted to a digital representation of sensed terminal voltage $V_T(t)$ by an analog-to-digital converter (ADC) 403. Similarly, sensed voltage $V_S(t)$, indicative of current x(t), may be conditioned by an AFE 402 and converted to a digital representation by an ADC 404.

Each of the digital representations of sensed terminal voltage $V_T(t)$ and sensed voltage $V_S(t)$ may be received and processed by a respective windowing filter 416 that may apply a window function W[n] to each of these digital representations. In some embodiments, windowing function may have a variable length N, based on a pilot tone frequency and/or pilot tone length used to drive electromagnetic load 301. Further, impedance measurement subsystem 308 may include a plurality of fast Fourier transform (FFT) blocks 418, each FFT block 418 configured to perform a fast Fourier transform on a respective output of the windowing filters 416. In addition, an impedance estimator 410 may determine coil impedance $Z_{COIL}$ in accordance with Ohm's law based on the windowed and transformed digital representations of sensed terminal voltage $V_T(t)$ and sensed voltage $V_S(t)$, as described in greater detail above.

As briefly mentioned above, windowing of signals by windowing filters 416 prior to application of the discrete Fourier transforms of FFT blocks 418 may filter out harmonics and attenuate frequencies far from the signal frequency, as well as reduce leakage in the discrete Fourier transform computations. In signal processing and statistics, a window function (also known as an apodization function or tapering function) may be a mathematical function that is zero-valued outside of some chosen interval, normally symmetric around the middle of the interval, usually near a maximum in the middle, and usually tapering away from the middle.

Windowing filters 416 may be implemented using any known approach to windowing, including without limitation the use of Hann windows. In embodiments of the present disclosure, windowing filters 416 may be of variable sample length. Accordingly, the window function W[n], if implemented as a Hann window, may be given by:

$$W[n] = \sin\left(n \cdot \frac{\pi}{N}\right)\sin\left(n \cdot \frac{\pi}{N}\right), \text{ for } n = 1 \ldots N$$

where N is the length of a windowing filter 416, in terms of number of samples. As mentioned above, the length N may be variable based on a pilot tone frequency and/or pilot tone length used to drive electromagnetic load, and the length N may correspond to a number of samples of current and voltage to be measured.

As indicated by the equation above, calculation of window function W[n] may require computation of a sine function. Traditionally, computation of a sine function in processing hardware has typically involved a lookup table-based approach or a coordinate rotation digital computer (CORDIC) algorithm approach. The lookup table-based approach may not be feasible in the present disclosure as the value of N may vary. The CORDIC algorithm approach may also not be feasible, as it generally requires significant circuit area and consumes a large amount of electrical power during computation, as it may require many iterations (e.g., 16) to converge.

To overcome the disadvantages of these traditional approaches, windowing filters 416 (or another portion of processing subsystem 305) may compute their window functions W[n] in accordance with the approach below.

Upon determining the length N for a window function W[n], processing subsystem 305 may determine an initial sine value sin_init and an initial cosine value cos_init as follows:

$$\text{sin\_init} = \sin\left(\frac{\pi}{N}\right)$$

$$\text{cos\_init} = \cos\left(\frac{\pi}{N}\right)$$

Further, it may be known that:

$$\sin\left(2 \cdot \frac{\pi}{N}\right) = \sin\left(\frac{\pi}{N} + \frac{\pi}{N}\right) = \sin\left(\frac{\pi}{N}\right) \cdot \cos\left(\frac{\pi}{N}\right) + \cos\left(\frac{\pi}{N}\right) \cdot \sin\left(\frac{\pi}{N}\right)$$

$$\sin\left(3 \cdot \frac{\pi}{N}\right) = \sin\left(2 \cdot \frac{\pi}{N} + \frac{\pi}{N}\right) = \sin\left(2 \cdot \frac{\pi}{N}\right) \cdot \cos\left(\frac{\pi}{N}\right) + \cos\left(2 \cdot \frac{\pi}{N}\right) \cdot \sin\left(\frac{\pi}{N}\right)$$

$$\sin\left(4 \cdot \frac{\pi}{N}\right) = \sin\left(3 \cdot \frac{\pi}{N} + \frac{\pi}{N}\right) = \sin\left(3 \cdot \frac{\pi}{N}\right) \cdot \cos\left(\frac{\pi}{N}\right) + \cos\left(3 \cdot \frac{\pi}{N}\right) \cdot \sin\left(\frac{\pi}{N}\right)$$

and so on.

Thus, after the initial sine value sin_init and the initial cosine value cos_init are determined, processing subsystem 305 may compute window function W[n] in accordance with an algorithm represented by the following pseudo-code:

```
sin[1] = sin_init
cos[1] = cos_init
```

```
    for (n=2:N)
    begin
        sin[n] = sin_init · cos[n − 1] + cos_init · sin[n − 1]
        cos[n] = cos_init · cos[n − 1] − sin_init · sin[n − 1]
        W[n] = sin[n] · sin[n]
    end
```

Figure 3:
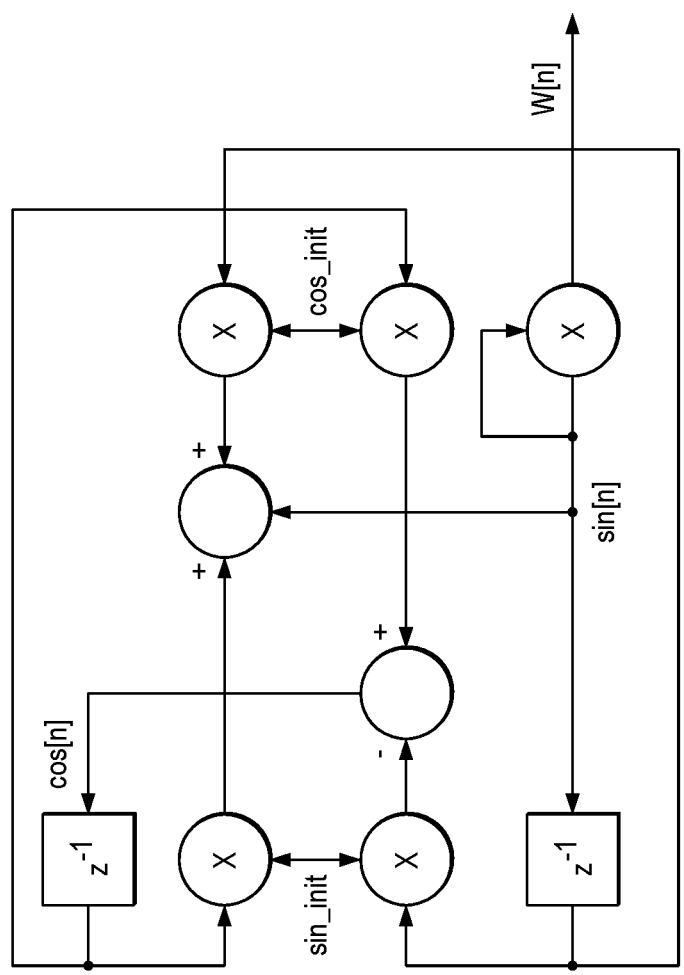
FIG. 3 illustrates an example functional block diagram of a system for generating a windowing function, in accordance with embodiments of the present disclosure.

FIG. 3 illustrates a block diagram equivalent to the pseudocode set forth above.

The approach set forth above employs basic properties of a sine calculation to generate various values of window function W[n]. Processing subsystem 305 may calculate and program initial sine value sin_init and an initial cosine value cos_init, and then calculate all subsequent values of the window function W[n] based on initial sine value sin_init and an initial cosine value cos_init. Such approach may only require two variables, each dependent upon window length N. Further, in terms of hardware requirements, this approach may require only two adders, five multiplier operations, and two memory elements (e.g., for storing a value of sin[n] and cos[n]). Such implementation may also enable generation of window function W[n] within a single sampling cycle of processing subsystem 305.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
    measuring a physical quantity associated with a load driven by an amplifier;
    generating a windowing function having a variable length and based on a number of samples of the physical quantity to be processed, wherein generating the windowing function comprises calculating initial values for the windowing function based on the number of samples;
    applying the windowing function to the physical quantity;
    performing a transform on the physical quantity as filtered by the windowing function; and
    determining a characteristic of the load based on the transform.

2. The method of claim 1, wherein the physical quantity is a voltage associated with the load.

3. The method of claim 1, wherein the physical quantity is an electrical current associated with the load.

4. The method of claim 1, wherein the transform is a discrete Fourier transform.

5. The method of claim 1, wherein the variable length and the number of samples are based on a pilot frequency for driving the load.

6. The method of claim 1, wherein the windowing function implements a Hann window.

7. The method of claim 1, wherein generating the windowing function further comprises calculating subsequent values for the windowing function based on the initial values.

8. The method of claim 1, wherein the characteristic is a complex impedance associated with the load.

9. A system comprising:
    a sensor configured to measure a physical quantity associated with a load driven by an amplifier; and
    a processing circuit communicatively coupled to the sensor and configured to:
        generate a windowing function having a variable length and based on a number of samples of the physical quantity to be processed, wherein generating the windowing function comprises calculating initial values for the windowing function based on the number of samples;
        apply the windowing function to the physical quantity;

perform a transform on the physical quantity as filtered by the windowing function; and determine a characteristic of the load based on the transform.

10. The system of claim 9, wherein the physical quantity is a voltage associated with the load.

11. The system of claim 9, wherein the physical quantity is an electrical current associated with the load.

12. The system of claim 9, wherein the transform is a discrete Fourier transform.

13. The system of claim 9, wherein the variable length and the number of samples are based on a pilot frequency for driving the load.

14. The system of claim 9, wherein the windowing function implements a Hann window.

15. The system of claim 9, wherein generating the windowing function further comprises calculating subsequent values for the windowing function based on the initial values.

16. The system of claim 9, wherein the characteristic is a complex impedance associated with the load.

17. A host device comprising:

an amplifier configured to drive a load;

a sensor configured to measure a physical quantity associated with the load; and a processing circuit communicatively coupled to the sensor and configured to:

generate a windowing function having a variable length and based on a number of samples of the physical quantity to be processed, wherein generating the windowing function comprises calculating initial values for the windowing function based on the number of samples;

apply the windowing function to the physical quantity;

perform a transform on the physical quantity as filtered by the windowing function; and determine a characteristic of the load based on the transform.

* * * * *